(12) United States Patent
Yousefpor et al.

(10) Patent No.: US 9,335,870 B2
(45) Date of Patent: May 10, 2016

(54) TOUCH-DISPLAY CROSSTALK

(75) Inventors: Marduke Yousefpor, San Jose, CA (US); Steven Porter Hotelling, Los Gatos, CA (US); Kevin J. White, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 366 days.

(21) Appl. No.: 12/877,070

(22) Filed: Sep. 7, 2010

(65) Prior Publication Data

US 2011/0298727 A1 Dec. 8, 2011

Related U.S. Application Data

(60) Provisional application No. 61/352,315, filed on Jun. 7, 2010.

(51) Int. Cl.
*G06F 3/041* (2006.01)
*G06F 3/045* (2006.01)
*G06F 3/044* (2006.01)
(Continued)

(52) U.S. Cl.
CPC .............. *G06F 3/044* (2013.01); *G02F 1/1362* (2013.01); *G02F 1/13338* (2013.01); *G06F 3/0412* (2013.01); *G06F 3/0418* (2013.01); *H01L 2224/48091* (2013.01)

(58) Field of Classification Search
CPC ......... G06F 3/044; G06F 3/041; G06F 17/00; G09G 5/00
USPC .......... 345/204–215, 690–699, 156, 173–179
See application file for complete search history.

(56) References Cited

U.S. PATENT DOCUMENTS

| 4,511,814 A * | 4/1985 | Matsuo et al. ................ 327/391 |
| 5,483,261 A | 1/1996 | Yasutake |
| 5,488,204 A | 1/1996 | Mead et al. |

(Continued)

FOREIGN PATENT DOCUMENTS

| CN | 101630082 A | 1/2010 |
| CN | 202306490 U | 7/2012 |

(Continued)

OTHER PUBLICATIONS

International Search Report mailed Nov. 2, 2011, for PCT Application No. PCT/US2011/039511, filed Jun. 7, 2011, five pages.

(Continued)

*Primary Examiner* — Kent Chang
*Assistant Examiner* — William Lu
(74) *Attorney, Agent, or Firm* — Morrison & Foerster LLP

(57) ABSTRACT

Clamping of a circuit element of a touch screen, such as a gate line of the display system of the touch screen, to a fixed voltage is provided. The circuit element can be clamped during a touch phase and unclamped during a display phase of the touch screen. A gate line system of a touch screen can include a first transistor with a source or drain connected to a first gate line, a second transistor with a source or drain connected to a second gate line, and a common conductive pathway connecting gates of the first and second transistors. A synchronization system can switch the first and second transistors to connect the first and second gate lines to a fixed voltage during a touch phase, and can switch the first and second transistors to disconnect the first and second gate lines from the fixed voltage during a display phase.

28 Claims, 11 Drawing Sheets

(51) Int. Cl.
  *G02F 1/1333* (2006.01)
  *G02F 1/1362* (2006.01)

(56) References Cited

U.S. PATENT DOCUMENTS

| | | | |
|---|---|---|---|
| 5,583,528 A | 12/1996 | Ebihara | |
| 5,796,276 A * | 8/1998 | Phillips et al. | 327/108 |
| 5,825,352 A | 10/1998 | Bisset et al. | |
| 5,835,079 A | 11/1998 | Shieh | |
| 5,862,248 A * | 1/1999 | Salatino | G06F 3/044 382/124 |
| 5,880,411 A | 3/1999 | Gillespie et al. | |
| 6,188,391 B1 | 2/2001 | Seely et al. | |
| 6,239,788 B1 * | 5/2001 | Nohno et al. | 345/173 |
| 6,310,610 B1 | 10/2001 | Beaton et al. | |
| 6,323,846 B1 * | 11/2001 | Westerman et al. | 345/173 |
| 6,593,757 B2 | 7/2003 | Nakayama et al. | |
| 6,690,387 B2 | 2/2004 | Zimmerman et al. | |
| 7,015,894 B2 | 3/2006 | Morohoshi | |
| 7,184,064 B2 | 2/2007 | Zimmerman et al. | |
| 7,567,228 B1 | 7/2009 | Wen et al. | |
| 7,602,383 B2 * | 10/2009 | Hsieh | G06F 3/044 178/18.03 |
| 7,663,607 B2 | 2/2010 | Hotelling et al. | |
| 8,154,533 B2 | 4/2012 | Jung et al. | |
| 8,232,955 B2 | 7/2012 | Kwon | |
| 8,479,122 B2 | 7/2013 | Hotelling et al. | |
| 2004/0227499 A1 * | 11/2004 | Date et al. | 323/315 |
| 2005/0116937 A1 * | 6/2005 | Choi et al. | 345/173 |
| 2005/0206602 A1 * | 9/2005 | Kojima | 345/96 |
| 2005/0258771 A1 * | 11/2005 | Kang et al. | 315/169.1 |
| 2006/0026521 A1 | 2/2006 | Hotelling et al. | |
| 2006/0114247 A1 * | 6/2006 | Brown | 345/204 |
| 2006/0197753 A1 | 9/2006 | Hotelling | |
| 2006/0214918 A1 * | 9/2006 | Destura et al. | 345/173 |
| 2006/0256093 A1 * | 11/2006 | Furukawa et al. | 345/173 |
| 2007/0013634 A1 * | 1/2007 | Saiki et al. | 345/98 |
| 2007/0046659 A1 * | 3/2007 | Iwami et al. | 345/211 |
| 2008/0309627 A1 * | 12/2008 | Hotelling et al. | 345/173 |
| 2009/0066614 A1 * | 3/2009 | Ishii et al. | 345/76 |
| 2009/0251433 A1 | 10/2009 | Park et al. | |
| 2010/0231552 A1 * | 9/2010 | Saito et al. | 345/174 |
| 2010/0245335 A1 * | 9/2010 | Kimura et al. | 345/213 |
| 2010/0253638 A1 | 10/2010 | Yousefpor et al. | |
| 2010/0302202 A1 * | 12/2010 | Takeuchi et al. | 345/174 |
| 2010/0328239 A1 * | 12/2010 | Harada et al. | 345/173 |
| 2011/0254802 A1 * | 10/2011 | Philipp | 345/174 |

FOREIGN PATENT DOCUMENTS

| | | |
|---|---|---|
| EP | 2 141 573 A2 | 1/2010 |
| JP | 3419795 B2 | 12/1992 |
| JP | 2000-163031 A | 6/2000 |
| JP | 2001-165606 A | 6/2001 |
| JP | 2002-342033 A | 11/2002 |
| KR | 10-2006-0073590 A | 6/2006 |
| KR | 1020090016251 A | 2/2009 |
| KR | 1020090105716 A | 10/2009 |
| KR | 1020090121040 A | 11/2009 |
| TW | 201011727 A | 3/2010 |
| WO | WO-2005/015373 A2 | 2/2005 |
| WO | WO 2007146785 A2 * | 12/2007 |
| WO | WO-2008/047990 A1 | 4/2008 |
| WO | WO-2011/156418 A1 | 12/2011 |

OTHER PUBLICATIONS

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

Rubine, D.H. (Dec. 1991). "The Automatic Recognition of Gestures," CMU-CS-91-202, Submitted in Partial Fulfillment of the Requirements of the Degree of Doctor of Philosophy in Computer Science at Carnegie Mellon University, 285 pages.

Rubine, D.H. (May 1992). "Combining Gestures and Direct Manipulation," CHI '92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

TW Search Report mailed Feb. 21, 2014, for TW Patent Application No. 100119438, with English translation, two pages.

* cited by examiner

TOUCH-DISPLAY CROSSTALK

CROSS REFERENCE TO RELATED APPLICATIONS

This application claims benefit of U.S. Provisional Application No. 61/352,315, filed Jun. 7, 2010, the contents of which are incorporated by reference herein in their entirety for all purposes.

FIELD OF THE DISCLOSURE

This relates generally to touch sensing, and more particularly, to crosstalk that can occur between touch circuitry and display circuitry in touch screens.

BACKGROUND OF THE DISCLOSURE

Many types of input devices are presently available for performing operations in a computing system, such as buttons or keys, mice, trackballs, joysticks, touch sensor panels, touch screens and the like. Touch screens, in particular, are becoming increasingly popular because of their ease and versatility of operation as well as their declining price. Touch screens can include a touch sensor panel, which can be a clear panel with a touch-sensitive surface, and a display device such as a liquid crystal display (LCD) that can be positioned partially or fully behind the panel so that the touch-sensitive surface can cover at least a portion of the viewable area of the display device. Touch screens can allow a user to perform various functions by touching the touch sensor panel using a finger, stylus or other object at a location often dictated by a user interface (UI) being displayed by the display device. In general, touch screens can recognize a touch and the position of the touch on the touch sensor panel, and the computing system can then interpret the touch in accordance with the display appearing at the time of the touch, and thereafter can perform one or more actions based on the touch. In the case of some touch sensing systems, a physical touch on the display is not needed to detect a touch. For example, in some capacitive-type touch sensing systems, fringing fields used to detect touch can extend beyond the surface of the display, and objects approaching near the surface may be detected near the surface without actually touching the surface.

Capacitive touch sensor panels can be formed from a matrix of drive and sense lines of a substantially transparent conductive material, such as Indium Tin Oxide (ITO), often arranged in rows and columns in horizontal and vertical directions on a substantially transparent substrate. It is due in part to their substantial transparency that capacitive touch sensor panels can be overlaid on a display to form a touch screen, as described above. Some touch screens can be formed by integrating touch sensing circuitry into a display pixel stackup (i.e., the stacked material layers forming the display pixels).

SUMMARY

The following description includes examples of reducing crosstalk between touch circuitry and display circuitry of touch screens. In some embodiments, a circuit element of a touch screen, such as a gate line of the display system of the touch screen, can be clamped to a fixed voltage, which can help reduce crosstalk and help reduce errors in, for example, touch sensing signals of the touch sensing system. The gate line can be clamped during a touch phase and unclamped during a display phase of the touch screen, during which the gate line can operate as part of the display system. In some embodiments, a gate line system of a touch screen can include a first transistor with a source or drain connected to a first gate line, a second transistor with a source or drain connected to a second gate line, and a common conductive pathway connecting gates of the first and second transistors. In some embodiments, a synchronization system can switch the first and second transistors to connect the first and second gate lines to a fixed voltage during the touch phase, and can switch the first and second transistors to disconnect the first and second gate lines from the fixed voltage during the display phase.

DETAILED DESCRIPTION

Figure 1C:
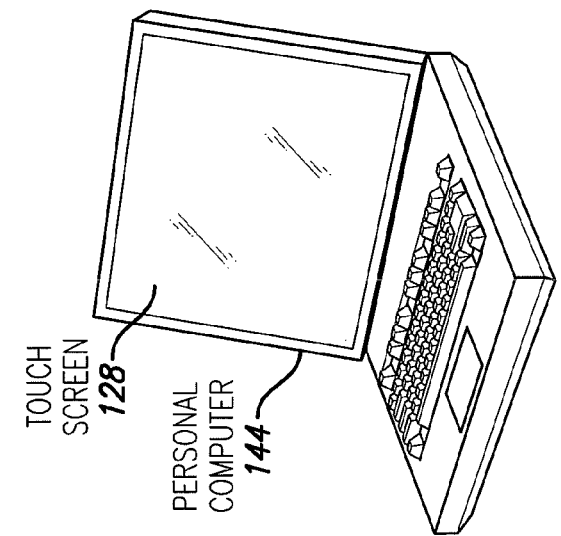
FIGS. 1A-1C illustrate an example mobile telephone, an example media player, and an example personal computer that each include an example touch screen according to embodiments of the disclosure.

In the following description of example embodiments, reference is made to the accompanying drawings which form a part hereof, and in which it is shown by way of illustration specific embodiments in which embodiments of the disclosure can be practiced. It is to be understood that other embodiments can be used and structural changes can be made without departing from the scope of the embodiments of this disclosure.

The following description includes examples in which a circuit element of a touch screen, such as a gate line of the display system of the touch screen, can be clamped to a fixed voltage, which can help reduce crosstalk between, for example, the display system and the touch sensing system. Reducing crosstalk can be beneficial because crosstalk can introduce errors in, for example, touch sensing signals of the touch sensing system. Touch sensing circuitry in devices such as touch panels, touch screens, etc., can be exposed to various sources of error that can enter the touch sensing system through various error mechanisms. For example, touch sensing circuitry can operate alongside other types of circuitry, such as in a touch screen formed by a touch panel overlay on a display screen. Close proximity of touch and display circuitry may cause undesirable interference, such as crosstalk, with touch sensing. Sources of error can enter the touch sensing system through mechanisms. For example, a display system of a touch screen may change a voltage across a liquid crystal cell to display an image, but the voltage change can cause the dielectric constant of the liquid crystal to change in a way that introduces error in the touch sensing system through an error mechanism, or error path, that can include, for example, a gate line of the display system.

Errors in touch sensing can include any portion of a touch sensing measurement that does not carry information about touch. A touch sensing signal output from a touch sensor can be a composite signal, for example, that includes one or more signals caused by a touch, and carrying touch information about the touch, and one or more signals caused by other sources, such as electrical interference, crosstalk, etc., that do not provide information about the touch. Some error sources can cause a change in the operation of touch sensing that causes the portion of the touch sensing signal that carries touch information to inaccurately reflect the amount of touch. For example, an error source could cause a drive signal to be generated with an abnormally high voltage, which could result in the sense signal sensing a touch to be abnormally high as well. Thus, a portion of the touch information itself could include an error.

As touch sensing circuitry becomes more closely integrated with circuitry of other systems, undesirable interaction between circuit elements of different systems can be more likely to occur. For example, touch sensing circuitry can be integrated into the display pixel stackups of integrated touch screens. Display pixel stackups are typically manufactured by processes including depositing, masking, etching, doping, etc., of materials such as conductive materials (e.g., metal, substantially transparent conductors), semiconductive materials (e.g., polycrystalline silicon (Poly-Si)), and dielectric materials (e.g., SiO2, organic materials, SiNx). Various elements formed within a display pixel stackup can operate as circuitry of the display system to generate an image on the display, while other elements can operate as circuitry of a touch sensing system that senses one or more touches on or near the display.

The following description includes examples in which the errors in touch sensing introduced through various error mechanisms can be compensated. In one example, a gate line can form part of an electrical path that can potentially couple undesirable signals into the touch sensing signal, i.e., crosstalk. However, in accordance with example embodiments, the gate line can be clamped to a fixed voltage, which can help to reduce or to eliminate an amount of crosstalk. In other words, the clamping can help to remove, partially or fully, the gate line from the particular error mechanism, which can help to reduce or eliminate the amount of error that can be introduced into a touch sensing signal through the error mechanism.

Although example embodiments are described below in relation to integrated touch screens, other types of touch sensing arrangements can be used, for example, non-integrated touch screens, touchpads, etc.

Figure 1B:
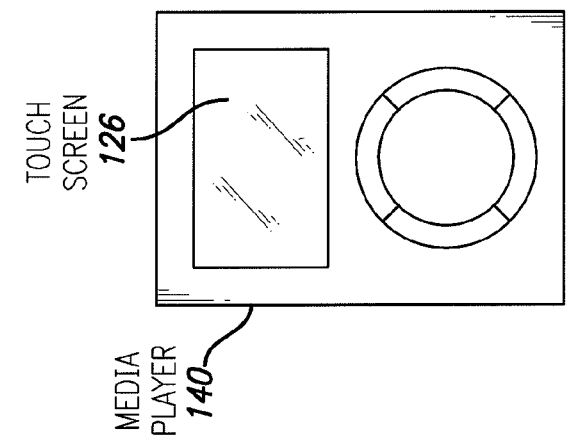
Figure 1A:
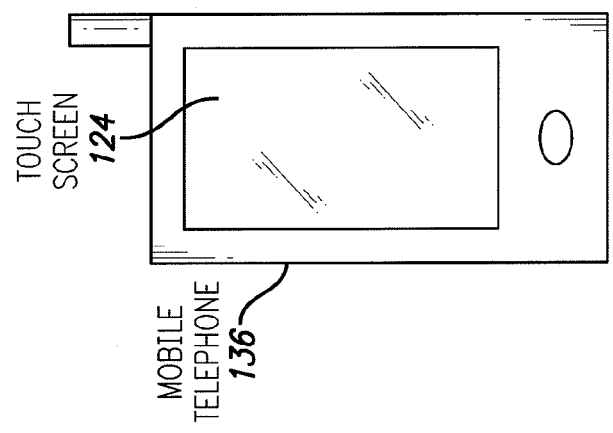

FIGS. 1A-1C show example systems in which a touch screen according to embodiments of the disclosure may be implemented. FIG. 1A illustrates an example mobile telephone 136 that includes a touch screen 124. FIG. 1B illustrates an example digital media player 140 that includes a touch screen 126. FIG. 1C illustrates an example personal computer 144 that includes a touch screen 128. Touch screens 124, 126, and 128 may be based on, for example, self capacitance or mutual capacitance, or another touch sensing technology. For example, in a self capacitance based touch system, an individual electrode with a self-capacitance to ground can be used to form a touch pixel for detecting touch. As an object approaches the touch pixel, an additional capacitance to ground can be formed between the object and the touch pixel. The additional capacitance to ground can result in a net increase in the self-capacitance seen by the touch pixel. This increase in self-capacitance can be detected and measured by a touch sensing system to determine the positions of multiple objects when they touch the touch screen. A mutual capacitance based touch system can include, for example, drive regions and sense regions, such as drive lines and sense lines. For example, drive lines can be formed in rows while sense lines can be formed in columns (e.g., orthogonal). Touch pixels can be formed at the intersections of the rows and columns. During operation, the rows can be stimulated with an AC waveform and a mutual capacitance can be formed between the row and the column of the touch pixel. As an object approaches the touch pixel, some of the charge being coupled between the row and column of the touch pixel can instead be coupled onto the object. This reduction in charge coupling across the touch pixel can result in a net decrease in the mutual capacitance between the row and the column and a reduction in the AC waveform being coupled across the touch pixel. This reduction in the charge-coupled AC waveform can be detected and measured by the touch sensing system to determine the positions of multiple objects when they touch the touch screen. In some embodiments, a touch screen can be multi-touch, single touch, projection scan, full-imaging multi-touch, or any capacitive touch.

Figure 2:
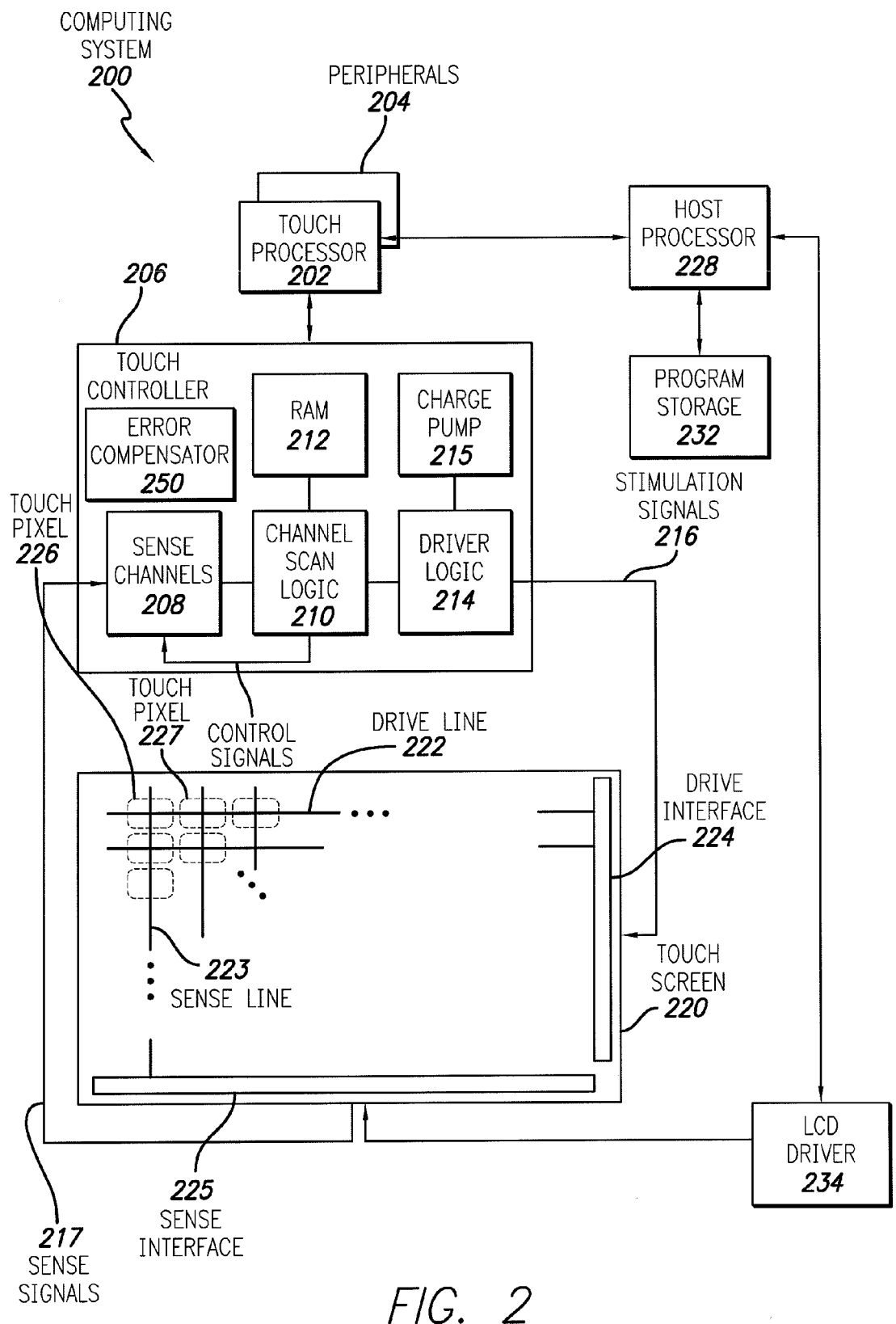
FIG. 2 is a block diagram of an example computing system that illustrates one implementation of an example touch screen according to embodiments of the disclosure.

FIG. 2 is a block diagram of an example computing system 200 that illustrates one implementation of an example touch screen 220 according to embodiments of the disclosure. Computing system 200 could be included in, for example, mobile telephone 136, digital media player 140, personal computer 144, or any mobile or non-mobile computing device that includes a touch screen. Computing system 200 can include a touch sensing system including one or more touch processors 202, peripherals 204, a touch controller 206, and touch sensing circuitry (described in more detail below). Peripherals 204 can include, but are not limited to, random access memory (RAM) or other types of memory or storage, watchdog timers and the like. Touch controller 206 can include, but is not limited to, one or more sense channels 208, channel scan logic 210 and driver logic 214. Channel scan logic 210 can access RAM 212, autonomously read data from the sense channels and provide control for the sense channels. In addition, channel scan logic 210 can control driver logic 214 to generate stimulation signals 216 at various frequencies and phases that can be selectively applied to drive regions of the touch sensing circuitry of touch screen 220, as described in more detail below. In some embodiments, touch controller 206, touch processor 202 and peripherals 204 can be integrated into a single application specific integrated circuit (ASIC). Touch controller 206 can also include an error compensator 250, which is described in more detail below.

Computing system 200 can also include a host processor 228 for receiving outputs from touch processor 202 and performing actions based on the outputs. For example, host processor 228 can be connected to program storage 232 and a display controller, such as an LCD driver 234. Host processor 228 can use LCD driver 234 to generate an image on touch screen 220, such as an image of a user interface (UI), and can use touch processor 202 and touch controller 206 to detect a touch on or near touch screen 220, such a touch input to the displayed UI. The touch input can be used by computer programs stored in program storage 232 to perform actions that can include, but are not limited to, moving an object such as a cursor or pointer, scrolling or panning, adjusting control settings, opening a file or document, viewing a menu, making a selection, executing instructions, operating a peripheral device connected to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. Host processor 228 can also perform additional functions that may not be related to touch processing.

Touch screen 220 can include touch sensing circuitry that can include a capacitive sensing medium having a plurality of drive lines 222 and a plurality of sense lines 223. It should be noted that the term "lines" is a sometimes used herein to mean simply conductive pathways, as one skilled in the art will readily understand, and is not limited to elements that are strictly linear, but includes pathways that change direction, and includes pathways of different size, shape, materials, etc. Drive lines 222 can be driven by stimulation signals 216 from driver logic 214 through a drive interface 224, and resulting sense signals 217 generated in sense lines 223 can be transmitted through a sense interface 225 to sense channels 208 (also referred to as an event detection and demodulation circuit) in touch controller 206. In this way, drive lines and sense lines can be part of the touch sensing circuitry that can interact to form capacitive sensing nodes, which can be thought of as touch picture elements (touch pixels), such as touch pixels 226 and 227. This way of understanding can be particularly useful when touch screen 220 is viewed as capturing an "image" of touch. In other words, after touch controller 206 has determined whether a touch has been detected at each touch pixel in the touch screen, the pattern of touch pixels in the touch screen at which a touch occurred can be thought of as an "image" of touch (e.g. a pattern of fingers touching the touch screen).

Figure 3:
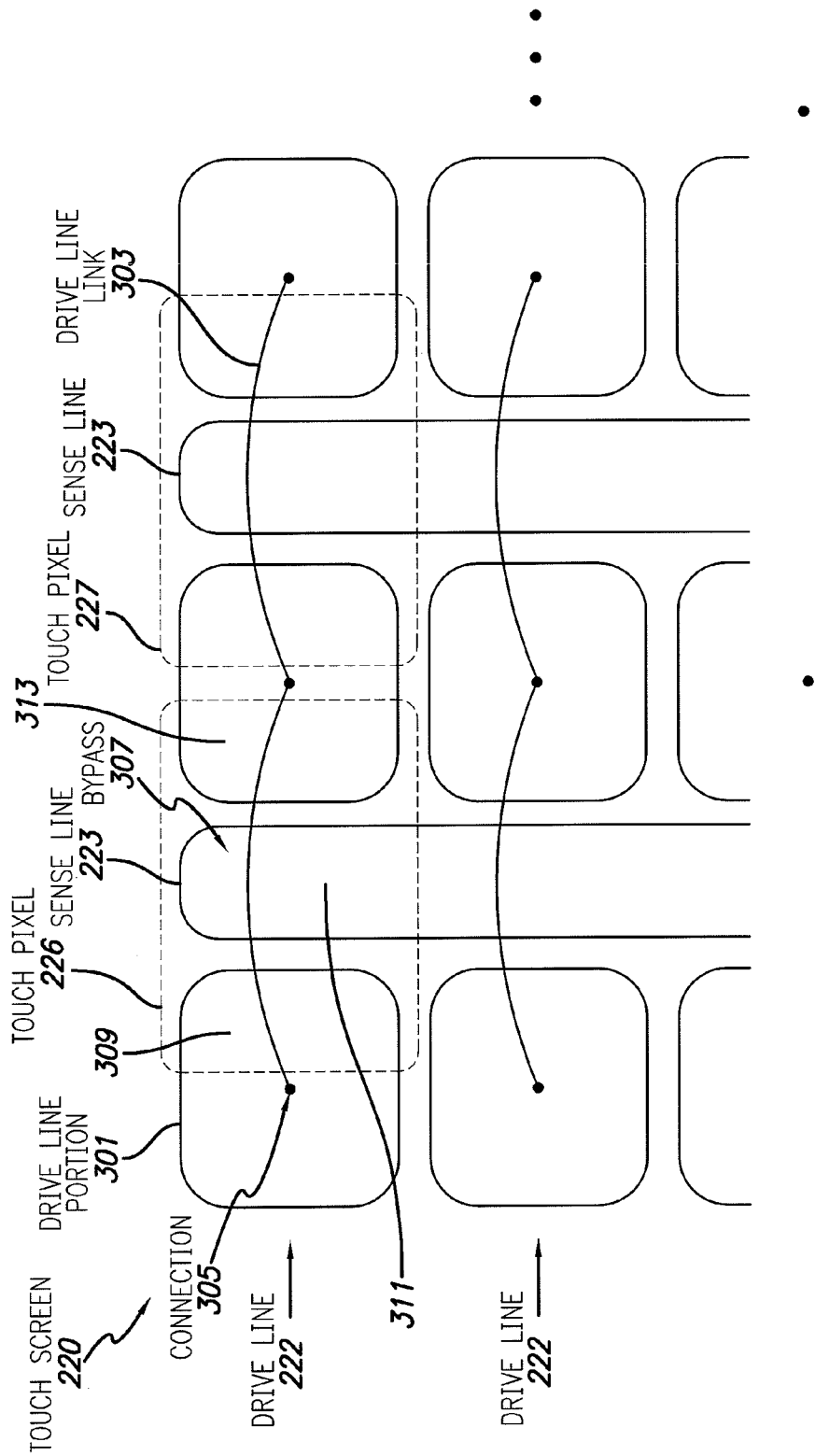
FIG. 3 is a more detailed view of the touch screen of FIG. 2 showing an example configuration of drive lines and sense lines according to embodiments of the disclosure.

In some example embodiments, touch screen 220 can be an integrated touch screen in which touch sensing circuit elements of the touch sensing system can be integrated into the display pixels stackups of a display. An example integrated touch screen in which embodiments of the disclosure can be implemented with now be described with reference to FIGS. 3-6. FIG. 3 is a more detailed view of touch screen 220 showing an example configuration of drive lines 222 and sense lines 223 according to embodiments of the disclosure. As shown in FIG. 3, each drive line 222 can be formed of one or more drive line segments 301 that can be electrically connected by drive line links 303 at connections 305. Drive line links 303 are not electrically connected to sense lines 223, rather, the drive line links can bypass the sense lines through bypasses 307. Drive lines 222 and sense lines 223 can interact capacitively to form touch pixels such as touch pixels 226 and 227. Drive lines 222 (i.e., drive line segments 301 and corresponding drive line links 303) and sense lines 223 can be formed of electrical circuit elements in touch screen 220. In the example configuration of FIG. 3, each of touch pixels 226 and 227 can include a portion of one drive line segment 301, a portion of a sense line 223, and a portion of another drive line segment 301. For example, touch pixel 226 can include a right-half portion 309 of a drive line segment on one side of a portion 311 of a sense line, and a left-half portion 313 of a drive line segment on the opposite side of portion 311 of the sense line.

Figure 4:
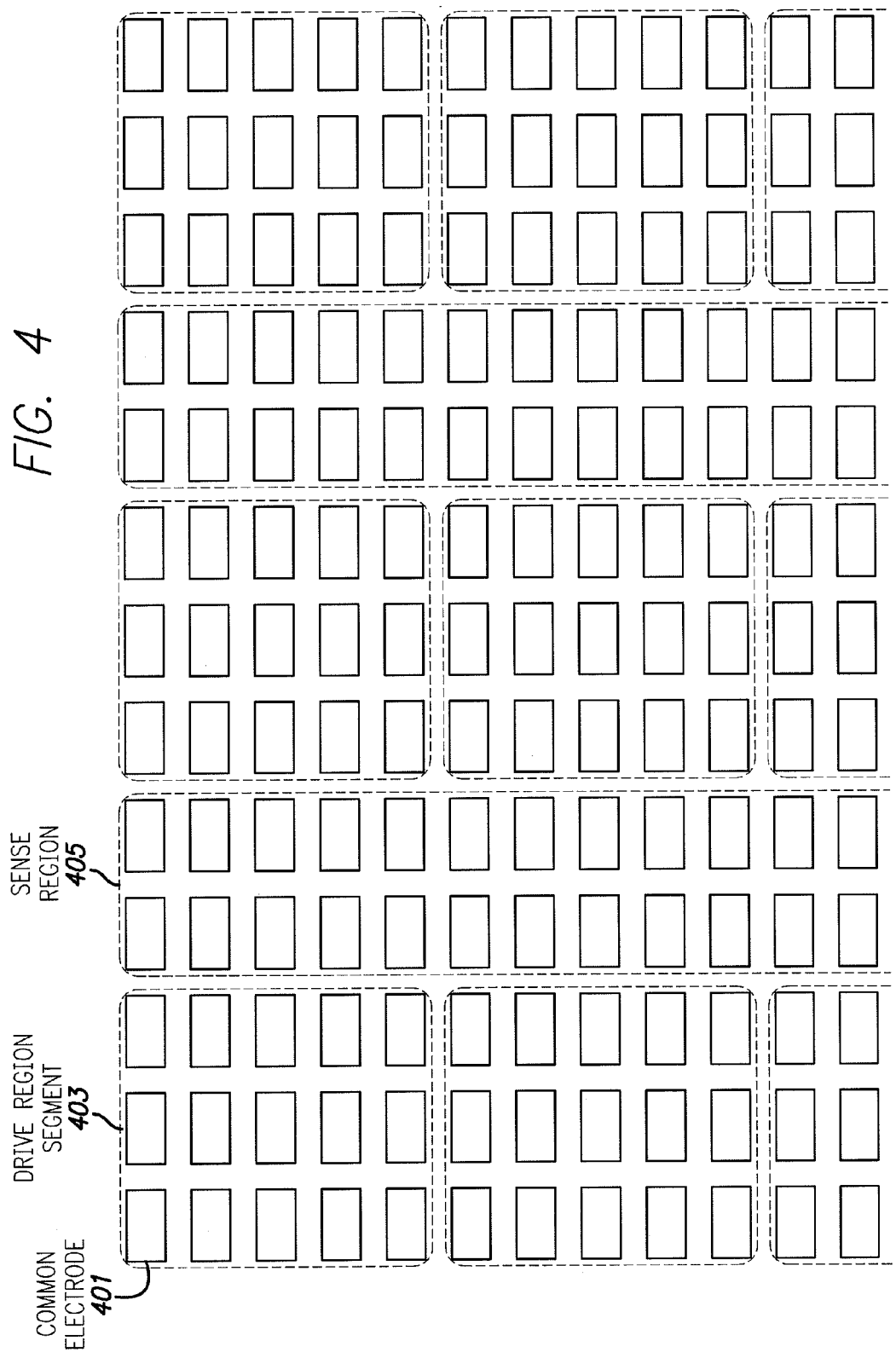
FIG. 4 illustrates an example configuration in which touch sensing circuitry includes common electrodes (Vcom) according to embodiments of the disclosure.

The circuit elements can include, for example, elements that can exist in conventional LCD displays, as described above. It is noted that circuit elements are not limited to whole circuit components, such a whole capacitor, a whole transistor, etc., but can include portions of circuitry, such as only one of the two plates of a parallel plate capacitor. FIG. 4 illustrates an example configuration in which common electrodes (Vcom) can form portions of the touch sensing circuitry of a touch sensing system. Each display pixel includes a common electrode 401, which is a circuit element of the display system circuitry in the pixel stackup (i.e., the stacked material layers forming the display pixels) of the display pixels of some types of conventional LCD displays, e.g., fringe field switching (FFS) displays, that can operate as part of the display system to display an image.

In the example shown in FIG. 4, each common electrode (Vcom) 401 can serve as a multi-function circuit element that can operate as display circuitry of the display system of touch screen 220 and can also operate as touch sensing circuitry of the touch sensing system. In this example, each common electrode 401 can operate as a common electrode of the display circuitry of the touch screen, and can also operate together when grouped with other common electrodes as touch sensing circuitry of the touch screen. For example, a group of common electrodes 401 can operate together as a capacitive part of a drive line or a sense line of the touch sensing circuitry during the touch sensing phase. Other circuit elements of touch screen 220 can form part of the touch sensing circuitry by, for example, electrically connecting together common electrodes 401 of a region, switching electrical connections, etc. In general, each of the touch sensing circuit elements may be either a multi-function circuit element that can form part of the touch sensing circuitry and can perform one or more other functions, such as forming part of the display circuitry, or may be a single-function circuit element that can operate as touch sensing circuitry only. Similarly, each of the display circuit elements may be either a multi-function circuit element that can operate as display circuitry and perform one or more other functions, such as operating as touch sensing circuitry, or may be a single-function circuit element that can operate as display circuitry only. Therefore, in some embodiments, some of the circuit elements in the display pixel stackups can be multi-function circuit elements and other circuit elements may be single-function circuit elements. In other embodiments, all of the circuit elements of the display pixel stackups may be single-function circuit elements.

In addition, although example embodiments herein may describe the display circuitry as operating during a display phase, and describe the touch sensing circuitry as operating during a touch sensing phase, it should be understood that a display phase and a touch sensing phase may be operated at the same time, e.g., partially or completely overlap, or the display phase and touch phase may operate at different times. Also, although example embodiments herein describe certain circuit elements as being multi-function and other circuit elements as being single-function, it should be understood that the circuit elements are not limited to the particular functionality in other embodiments. In other words, a circuit element that is described in one example embodiment herein as a single-function circuit element may be configured as a multi-function circuit element in other embodiments, and vice versa.

For example, FIG. 4 shows common electrodes 401 grouped together to form drive region segments 403 and sense regions 405 that generally correspond to drive line segments 301 and sense lines 223, respectively. Grouping multi-function circuit elements of display pixels into a region can mean operating the multi-function circuit elements of the display pixels together to perform a common function of the region. Grouping into functional regions may be accomplished through one or a combination of approaches, for example, the structural configuration of the system (e.g., physical breaks and bypasses, voltage line configurations), the operational configuration of the system (e.g., switching circuit elements on/off, changing voltage levels and/or signals on voltage lines), etc.

Multi-function circuit elements of display pixels of the touch screen can operate in both the display phase and the touch phase. For example, during a touch phase, common electrodes 401 can be grouped together to form touch signal lines, such as drive regions and sense regions. In some embodiments circuit elements can be grouped to form a continuous touch signal line of one type and a segmented touch signal line of another type. For example, FIG. 4 shows one example embodiment in which drive region segments 403 and sense regions 405 correspond to drive line segments 301 and sense lines 223 of touch screen 220. Other configurations are possible in other embodiments, for example, common electrodes 401 could be grouped together such that drive lines are each formed of a continuous drive region and sense lines are each formed of a plurality of sense region segments linked together through connections that bypass a drive region.

The drive regions in the example of FIG. 3 are shown in FIG. 4 as rectangular regions including a plurality of common electrodes of display pixels, and the sense regions of FIG. 3 are shown in FIG. 4 as rectangular regions including a plurality of common electrodes of display pixels extending the vertical length of the LCD. In some embodiments, a touch pixel of the configuration of FIG. 4 can include, for example, a 64×64 area of display pixels. However, the drive and sense regions are not limited to the shapes, orientations, and positions shown, but can include any suitable configurations according to embodiments of the disclosure. It is to be understood that the display pixels used to form the touch pixels are not limited to those described above, but can be any suitable size or shape to permit touch capabilities according to embodiments of the disclosure.

Figure 5:
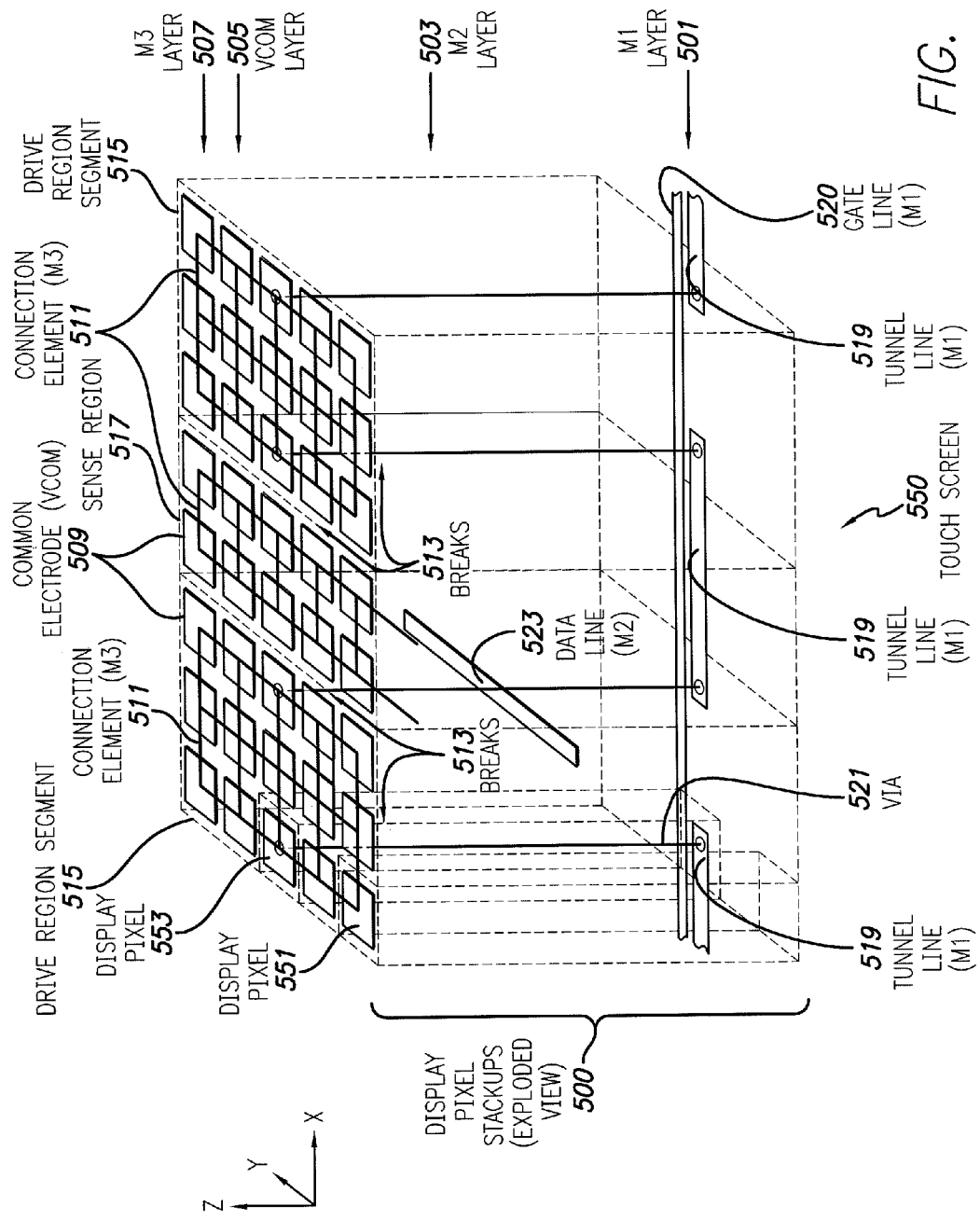
FIG. 5 illustrates an exploded view of example display pixel stackups according to embodiments of the disclosure.

FIG. 5 is a three-dimensional illustration of an exploded view (expanded in the z-direction) of example display pixel stackups 500 showing some of the elements within the pixel stackups of an example integrated touch screen 550. Stackups 500 can include a configuration of conductive lines that can be used to group common electrodes, such as common electrodes 401, into drive region segments and sense regions, such as shown in FIG. 4, and to link drive region segments to form drive lines.

Stackups 500 can include elements in a first metal (M1) layer 501, a second metal (M2) layer 503, a common electrode (Vcom) layer 505, and a third metal (3) layer 507. Each display pixel can include a common electrode 509, such as common electrodes 401 in FIG. 4, that is formed in Vcom layer 505. M3 layer 507 can include connection element 511 that can electrically connect together common electrodes 509. In some display pixels, breaks 513 can be included in connection element 511 to separate different groups of common electrodes 509 to form drive region segments 515 and a sense region 517, such as drive region segments 403 and sense region 405, respectively. Breaks 513 can include breaks in the x-direction that can separate drive region segments 515 from sense region 517, and breaks in the y-direction that can separate one drive region segment 515 from another drive region segment. M1 layer 501 can include tunnel lines 519 that can electrically connect together drive region segments 515 through connections, such as conductive vias 521, which can electrically connect tunnel line 519 to the grouped common electrodes in drive region segment display pixels. Tunnel line 519 can run through the display pixels in sense region 517 with no connections to the grouped common electrodes in the sense region, e.g., no vias 521 in the sense region. The M1 layer can also include gate lines 520. M2 layer 503 can include data lines 523. Only one gate line 520 and one data line 523 are shown for the sake of clarity; however, a touch screen can include a gate line running through each horizontal row of display pixels and multiple data lines running through each vertical row of display pixels, for example, one data line for each red, green, blue (RGB) color sub-pixel in each pixel in a vertical row of an RGB display integrated touch screen.

Structures such as connection elements 511, tunnel lines 519, and conductive vias 521 can operate as a touch sensing circuitry of a touch sensing system to detect touch during a touch sensing phase of the touch screen. Structures such as data lines 523, along with other pixel stackup elements such as transistors, pixel electrodes, common voltage lines, data lines, etc. (not shown), can operate as display circuitry of a display system to display an image on the touch screen during a display phase. Structures such as common electrodes 509 can operate as multifunction circuit elements that can operate as part of both the touch sensing system and the display system.

For example, in operation during a touch sensing phase, gate lines 520 can be clamped to a fixed voltage while stimulation signals can be transmitted through a row of drive region segments 515 connected by tunnel lines 519 and conductive vias 521 to form electric fields between the stimulated drive region segments and sense region 517 to create touch pixels, such as touch pixel 226 in FIG. 2. In this way, the row of connected together drive region segments 515 can operate as a drive line, such as drive line 222, and sense region 517 can operate as a sense line, such as sense line 223. When an object such as a finger approaches or touches a touch pixel, the object can affect the electric fields extending between the drive region segments 515 and the sense region 517, thereby reducing the amount of charge capacitively coupled to the sense region. This reduction in charge can be sensed by a sense channel of a touch sensing controller connected to the touch screen, such as touch controller 206 shown in FIG. 2, and stored in a memory along with similar information of other touch pixels to create an "image" of touch.

Figure 6:
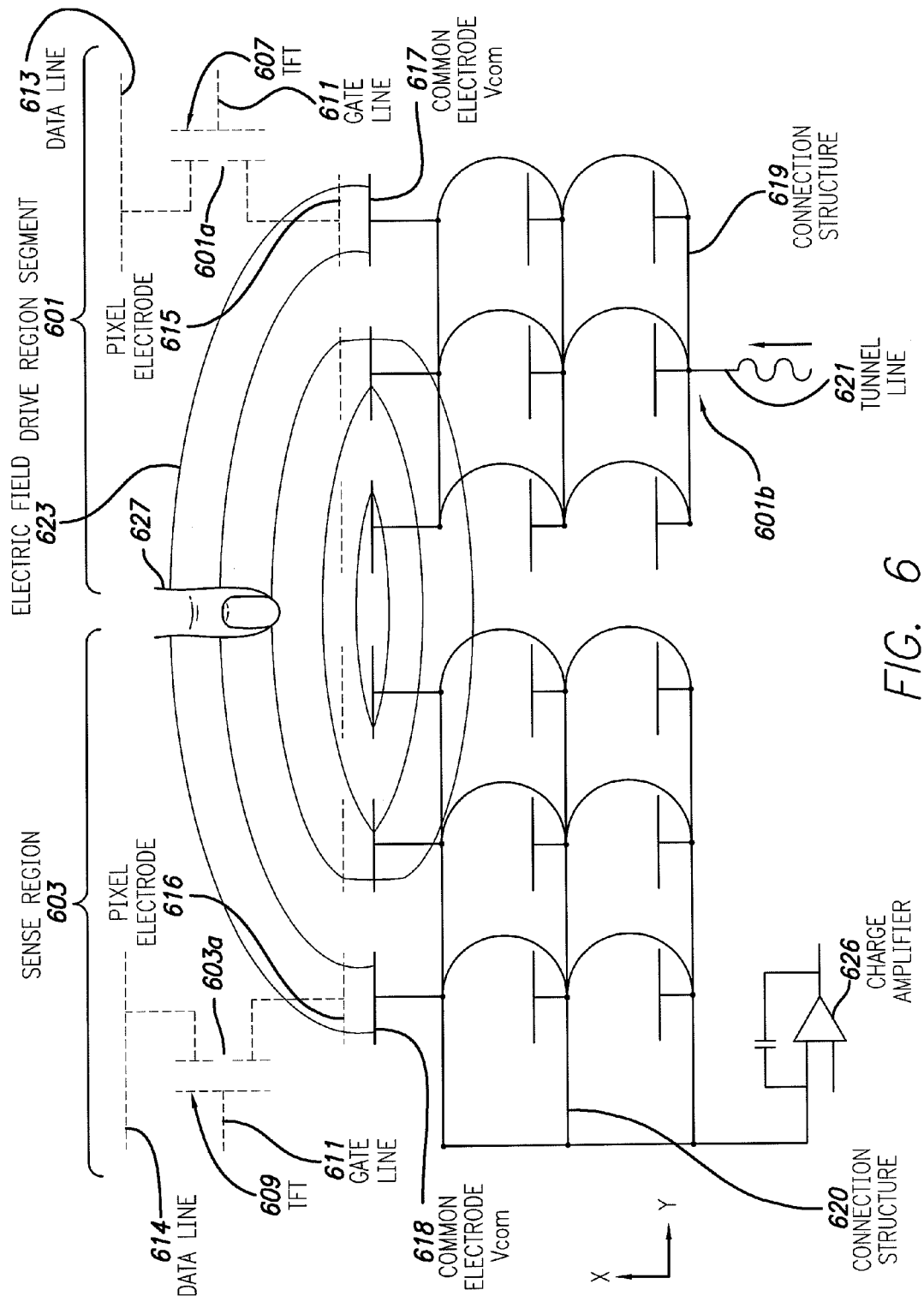
FIG. 6 illustrates an example touch sensing operation according to embodiments of the disclosure.

A touch sensing operation according to embodiments of the disclosure will be described with reference to FIG. 6. FIG. 6 shows partial circuit diagrams of some of the touch sensing circuitry within display pixels in a drive region segment 601 and a sense region 603 of an example touch screen according to embodiments of the disclosure. For the sake of clarity, only one drive region segment is shown. Also for the sake of clarity, FIG. 6 includes circuit elements illustrated with dashed lines to signify some circuit elements operate primarily as part of the display circuitry and not the touch sensing circuitry. In addition, a touch sensing operation is described primarily in terms of a single display pixel 601a of drive region segment 601 and a single display pixel 603a of sense region 603. However, it is understood that other display pixels in drive region segment 601 can include the same touch sensing circuitry as described below for display pixel 601a, and the other display pixels in sense region 603 can include the same touch sensing circuitry as described below for display pixel 603a. Thus, the description of the operation of display pixel 601a and display pixel 603a can be considered as a description of the operation of drive region segment 601 and sense region 603, respectively.

Referring to FIG. 6, drive region segment 601 includes a plurality of display pixels including display pixel 601a. Display pixel 601a can include a TFT 607, a gate line 611, a data line 613, a pixel electrode 615, and a common electrode 617. FIG. 6 shows common electrode 617 connected to the common electrodes in other display pixels in drive region segment 601 through a connection element 619 within the display pixels of drive region segment 601 that is used for touch sensing as described in more detail below. Sense region 603 includes a plurality of display pixels including display pixel 603a. Display pixel 603a includes a TFT 609, a data line 614, a pixel electrode 616, and a common electrode 618. TFT 609 can be connected to the same gate line 611 as TFT 607. FIG. 6 shows common electrode 618 connected to the common electrodes in other display pixels in sense region 603 through a connection element 620 that can be connected, for example, in a border region of the touch screen to form an element within the display pixels of sense region 603 that is used for touch sensing as described in more detail below.

During a touch sensing phase, gate line 611 can be connected to a fixed voltage source, such as a virtual ground in order to help reduce crosstalk, as described in more detail below. Drive signals can be applied to common electrodes 617 through a tunnel line 621 that is electrically connected to a portion of connection element 619 within a display pixel 601b of drive region segment 601. The drive signals, which are transmitted to all common electrodes 617 of the display pixels in drive region segment 601 through connection element 619, can generate an electrical field 623 between the common electrodes of the drive region segment and common electrodes 618 of sense region 603, which can be connected to a sense amplifier, such as a charge amplifier 626. Electrical charge can be injected into the structure of connected common electrodes of sense region 603, and charge amplifier 626 converts the injected charge into a voltage that can be measured. The amount of charge injected, and consequently the measured voltage, can depend on the proximity of a touch object, such as a finger 627, to the drive and sense regions. In this way, the measured voltage can provide an indication of touch on or near the touch screen.

Referring again to FIG. 5, it can be seen from FIG. 5 that some display pixels of touch screen 550 include different elements than other display pixels. For example, a display pixel 551 can include a portion of connection element 511 that has breaks 513 in the x-direction and the y-direction, and display pixel 551 does not include tunnel line 519. A display pixel 553 can include a portion of connection element 511 that has a break 513 in the x-direction, but not in the y-direction, and can include a portion of tunnel line 519 and a via 521. Other display pixels can include other differences in the configuration of stackup elements including, for example, no breaks 513 in connection element 511, a portion of tunnel line 519 without a via 521, etc. Differences in the configurations of the elements in display pixel stackups can result in different error mechanisms, as described in some examples below in more detail.

Figure 7:
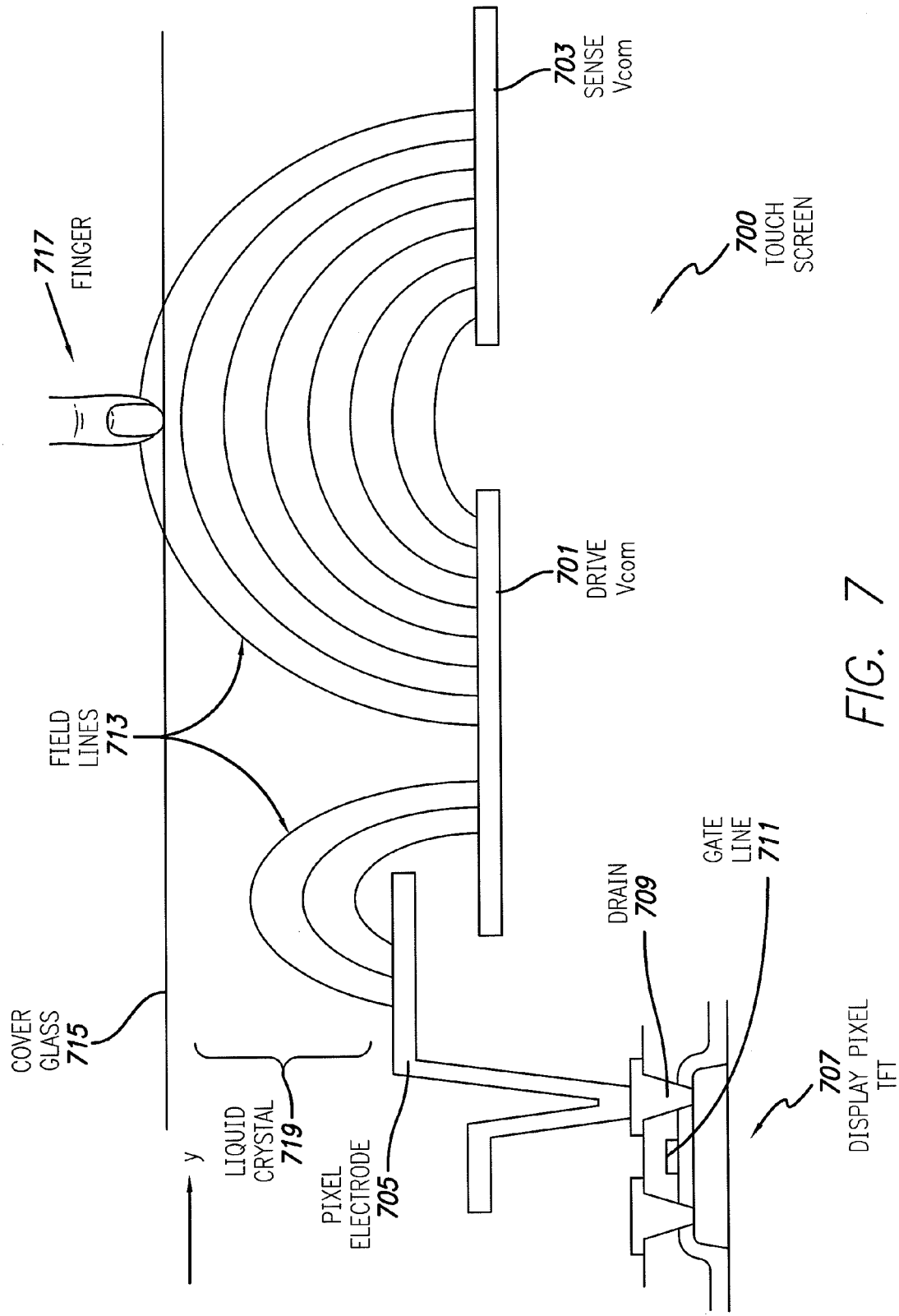
FIG. 7 illustrates a portion of an example touch screen during a touch sensing phase according to embodiments of the disclosure.

FIG. 7 illustrates one example structure of a display pixel according to one embodiment of the disclosure. FIG. 7 shows a touch screen 700 that can include a drive Vcom 701, a sense Vcom 703, and a pixel electrode 705. The pixel electrode 705 can be connected to a display pixel TFT 707 through a drain 709. Display pixel TFT 707 can include a gate line 711, which can be a common gate line to the sense Vcom 703 (although not shown in the figure). During a touch sensing phase, gate line 711 can be clamped to a fixed voltage VGL. Drive Vcom can be driven by a drive signal, which can generate field lines 713. Some of field lines 713 can exit a cover glass 715 and reach finger 717. The field lines 713 that are affected by finger 717 can allow sense Vcom 703 to measure touch information. As shown in the figure, some of field lines 713 that reach sense Vcom 703 do not penetrate cover glass 715. These field lines may detect little if any touch information about finger 717.

Some of field lines 713 emitted from drive Vcom 701 can reach pixel electrode 705. Consequently, part of the drive signal that can be driving drive Vcom 701 can be picked up pixel electrode 705, and this signal can be passed to gate line 711 through drain 709. In particular, even though gate line 711 may be clamped to a fixed voltage, there can be a capacitance between drain 709 and gate line 711 that can allow a capacitive coupling of the portion of the drive signal captured by pixel electrode 705 into gate line 711. The field lines 713 that are captured by pixel electrode 705 can travel through a liquid crystal 719 of the touch screen 700. Similarly, a portion of the field lines 713 between drive Vcom 701 and sense Vcom 703 can also travel through a portion of liquid crystal 719.

In some displays, for example, in-plane switching (IPS), the dielectric constant of the liquid crystal 719 can vary depending on the pixel electrode-to-drive Vcom voltage applied to the display pixel. In some embodiments, the dielectric constant of liquid crystal 719 can change dramatically (e.g., ranging from 3 to 10) in a direction parallel to cover glass 715 along the y-direction as indicated by the arrow in FIG. 7. The pixel electrode-to-drive Vcom voltage can be applied at different voltage values by the display system in order to set the luminance of each display pixel in proportion to the voltage value. In other words, the dielectric constants of the liquid crystal in the display pixels through which the field lines 713 travel can vary, particularly at the location where the field lines are approximately collinear with the y-direction as shown in the figure.

Although FIG. 7 illustrates a single drive Vcom 701 and a single sense Vcom 703, these Vcoms can in fact be connected together Vcoms of a particular drive region and sense region such as the regions shown in FIGS. 4 and 5. Therefore, although not shown in the figures, the field lines may pass through many display pixel with different luminances associated with each.

Figure 8:
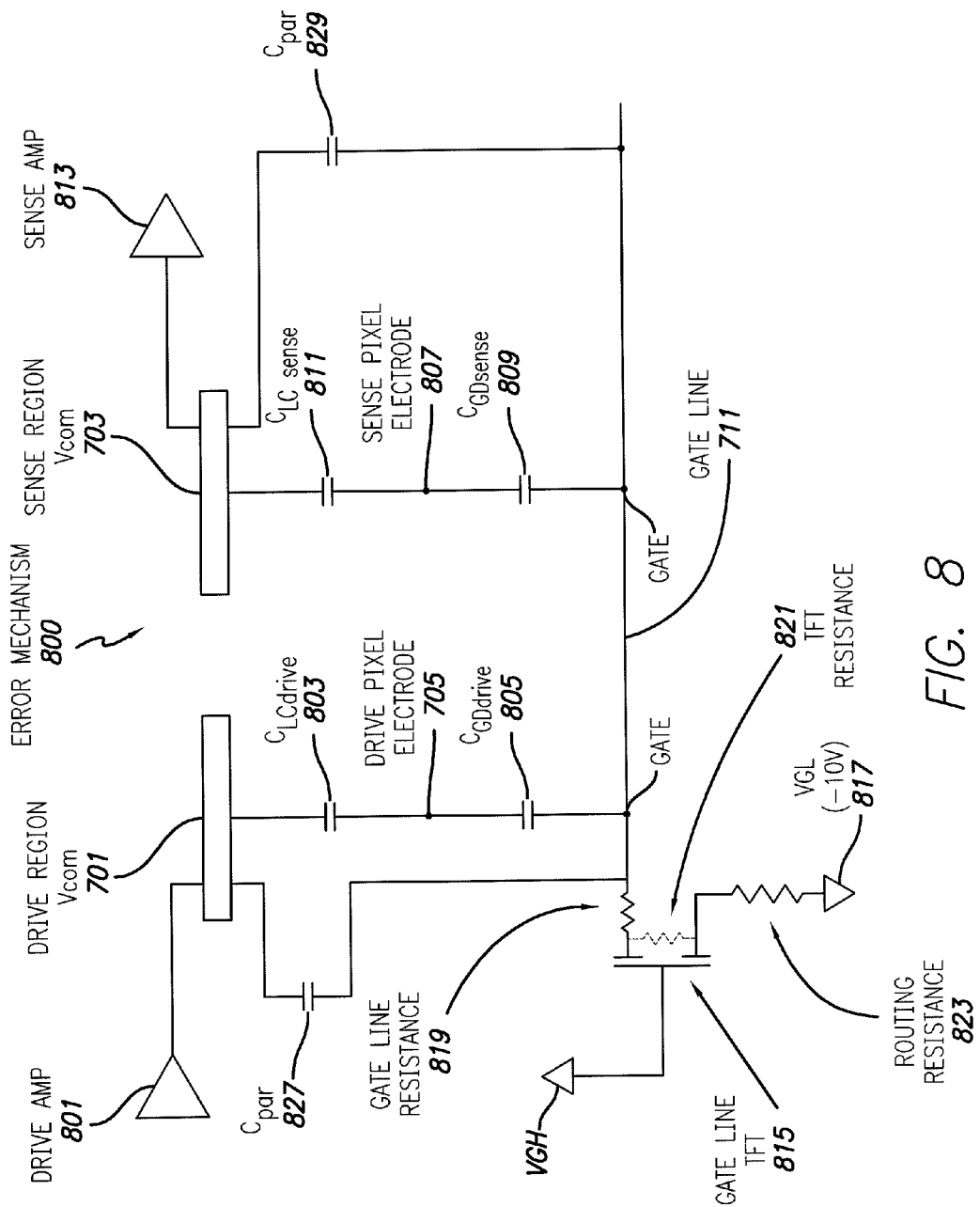
FIG. 8 illustrates a model of an example error mechanism in an example touch screen according to embodiments of the disclosure.

FIG. 8 illustrates an error mechanism 800 of the example portion of touch screen 700 in FIG. 7. A drive amplifier 801 can drive the drive region Vcom 701 with a drive signal as described above. A portion of the drive signal can be captured by pixel electrode 705 through field lines passing through liquid crystal 719. Liquid crystal 719 of display pixels in the drive region can have a capacitance, CLC drive 803. Once captured by pixel electrode 705, the signal can be passed to gate line 711 through a capacitance between drain 709 and gate line 711, CGD drive 805. Gate line 711 can be shared with the display pixels of the sense region, therefore the signal may be leaked into the display pixels of the sense region through a similar mechanism shown in the figure. In particular, the signal can pass into sense pixel electrode 807 through a gate-to-drain capacitance CGD sense 809 of the TFTs in the display pixels of the sense region. The signal can then be passed from pixel electrode 807 to sense region Vcom 703 through the liquid crystal 719 of the sense region display pixels, the liquid crystal having an associated capacitance CLC sense 811. The leaked signal can show up in the touch measurements detected by sense amplifier 813.

Parasitic capacitances Cpar 827, between drive Vcom 701 and gate line 711, and Cpar 829, between gate line 711 and sense Vcom 703, can form another pathway for crosstalk, e.g., another error mechanism.

During the touch phase, in order to help reduce the above-described leakage, gate line 711 can be clamped to a VGL voltage 817 through a gate line TFT 815. Ideally, if gate line 711 could be perfectly clamped to a fixed voltage such as VGL 817, then no leakage could occur between drive region Vcom 701 and sense region Vcom 703. However, various resistances associated with gate line 711 can prevent the gate line from being perfectly clamped, that is, can allow leakage of the drive signal from the drive region to the sense region. For example, gate line 711 can have a gate line resistance 819 that may be spread throughout the gate line, although in FIG. 8, it is shown in one location. Gate line TFT 815 can have an associated TFT resistance 821. Also, a routing resistance 823 can be associated with the conductive lines used to route the gate line TFT 815 to VGL 817.

Figure 9:
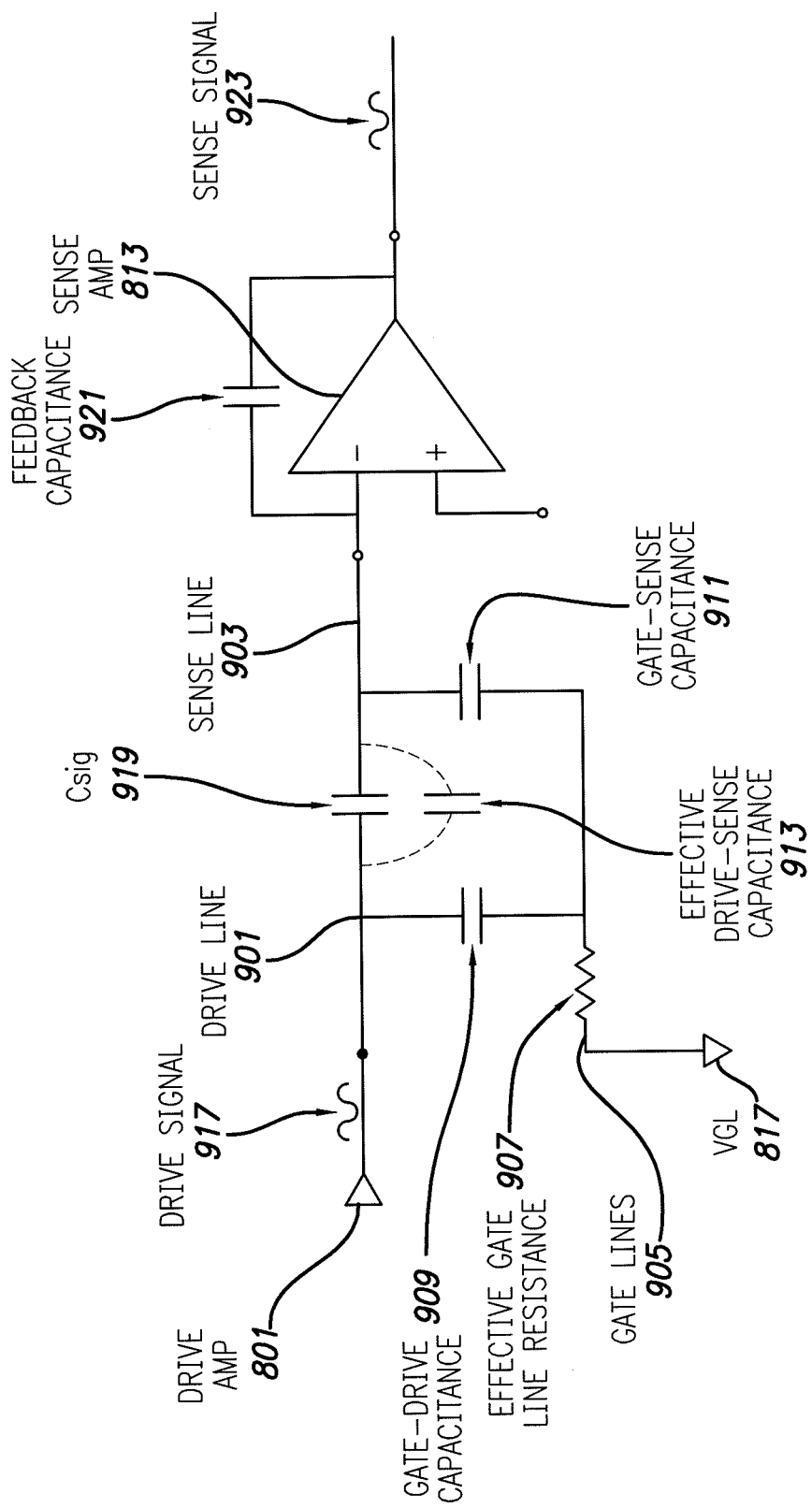
FIG. 9 illustrates a circuit diagram of a drive-sense operation of an example touch screen according to embodiments of the disclosure.

FIG. 9 illustrates an example circuit diagram of the example touch screen configuration 700 shown in FIG. 7. FIG. 9 includes the example error mechanism 800 of FIG. 8. In the previous examples of FIGS. 7 and 8, for the sake of clarity, only one drive Vcom/sense Vcom pair were described. However, as shown in the example embodiments described in FIGS. 4 through 6, the drive lines and sense lines of an integrated touch screen can include the Vcoms of multiple display pixels grouped together in a region of the touch screen. In the example circuit diagram of FIG. 9, a drive line 901 can include drive region segments such as drive region segment 403 linked together with bypasses as described in FIGS. 3 and 5, and a sense line 903 can include a sense region such as sense region 405 including a sense region such as sense region 405, including electrically connected together Vcoms of display pixels in the sense region as described in the figures. Gate lines 905 can include multiple gate lines such as gate lines 711 running through multiple rows of display pixels in the drive line 901 and portion of the sense line 903. For example, there may be 60 gate lines 905 in each drive line 901. An effective gate line resistance 907 can include a combination of resistances associated with the multiple gate lines 905, such as gate line resistance 819, TFT resistance 821, and routing resistance 823 of each of the 60 gate lines, for example. Likewise, a gate-drive capacitance 909 can include a combination of various capacitances between the multiple drive Vcom 701 and each corresponding gate line 905. For example, gate-drive capacitance 909 can include a combination of the CLC drive 803 and CGD drive 805 of each display pixel in the drive region. Likewise, a gate-sense capacitance 911 can include a combination of the CLC sense 811 and CGD sense 809 of all of the display pixels in the sense region. Effective drive-sense capacitance 913 can, therefore, represent the total effective capacitance between the drive and sense regions due to the various capacitances associated with each of the display pixels in the regions.

Drive amplifier 801 can generate a drive signal 917 on drive line 901 that can emanate from the multiple drive Vcoms in the drive region through the various error mechanisms of error mechanism 800, represented by effective drive-sense capacitance 913, as well as through touch-sensing mechanism to generate a signal capacitance, CSIG 919, which can represent touch information which is received by sense line 903 and amplified by sense amplifier 813, which can include a feedback capacitance 921 to result in a sense signal 923.

Therefore, sense signal 923 can be a superposition of multiple CSIG signals 919, carrying touch information, together with multiple signals due to error mechanism 800.

Figure 10:
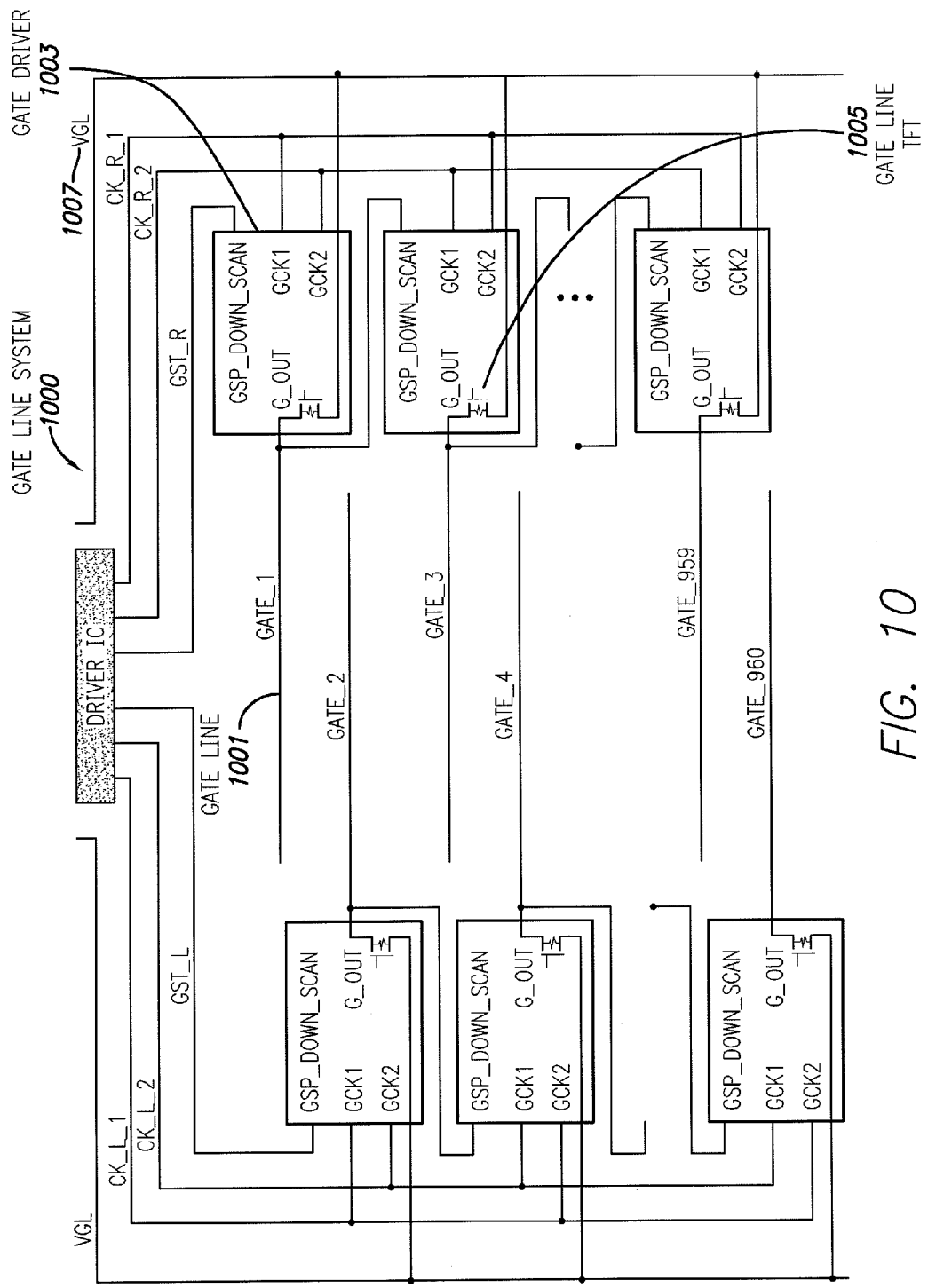
FIG. 10 illustrates an example gate line system in which gate lines can be shunted to a fixed voltage during a touch phase.

FIG. 10 illustrates an example touch screen gate line system 1000 including gate lines 1001 and gate drivers 1003. In this example, adjacent gate lines 1001 can be driven by gate drivers on opposite sides of the touch screen, and the end of a gate line opposite the gate driver can be electrically disconnected, i.e., is electrically floating. An alternating-side arrangement of gate drivers can provide some benefits, for example, in the configuration of the border regions. During a touch sensing phase of the touch screen, gate line TFTs 1005, such as gate line TFTs 815 of FIG. 8, can shunt gate lines 1001 to a low gate voltage source, VGL 1007. As described above with reference to FIG. 8, various resistances in the gate line system can reduce the effectiveness of the shunting to clamp the gate lines to VGL 1007, which can help to prevent crosstalk through the error mechanism described above.

Figure 11:
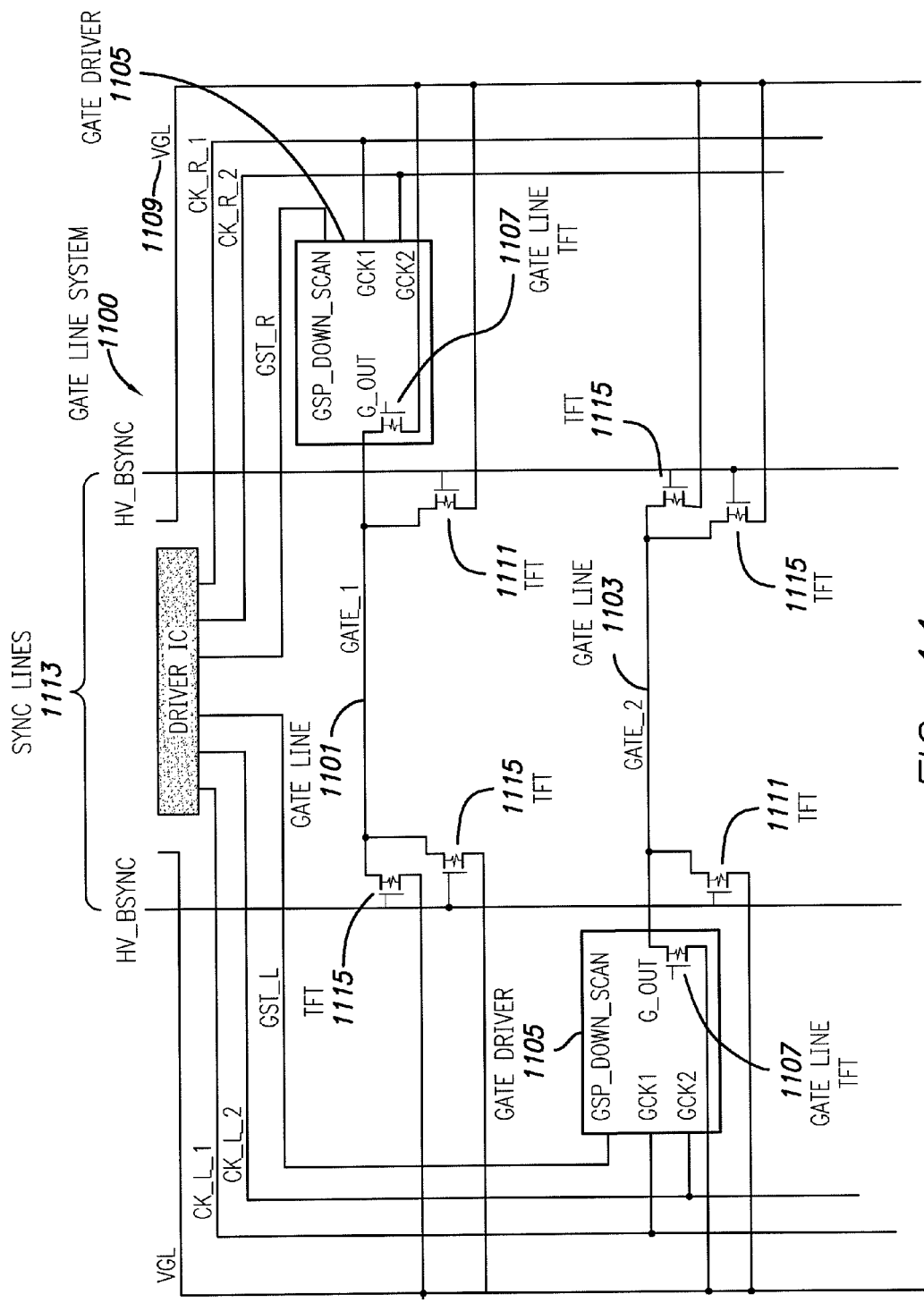
FIG. 11 illustrates an example gate line system including shunting transistors according to embodiments of the disclosure.

FIG. 11 illustrates an example touch screen gate line system 1100 according to embodiments of the disclosure. Gate line system 1100 can include gate lines, such as gate lines 1101 and 1103, and gate drivers 1105 in an alternating-side arrangement. Gate drivers 1105 can include gate line TFTs 1107 that can shunt gate lines 1101 and 1103 to a VGL 1109 during a touch sensing phase. Example gate line system 1100 also can include one or more additional transistors connected to each gate line. For example, one of the source or drain of a TFT 1111 can be connected to gate line 1101, and the other of the source or drain can be connected to VGL 1109. The gate of TFT 1111 can be connected to a synchronization line 1113 that can switch TFT 1111 on during the touch phase to connect gate line 1101 to VGL 1109 through TFT 1111 during the touch phase. This can provide an additional shunt of gate line 1101 in parallel to the shunt provided by gate line TFT 1107, thus reducing the effective TFT resistance from the gate line to VGL. Synchronization line 1113 can provide a way to switch TFT 1111 independently of gate line TFT 1107. In particular, this can allow gate line TFT 1107 to operate normally during the display phase, while TFT 1111 can be switched off and can remain off during the display phase.

Other transistors, such as TFTs 1115, can be connected to gate line 1101. For example, two TFTs 1115 can be connected in parallel to gate line 1101, and the gates of TFTs 1115 can be connected to synchronization line 1113 and switched on during the touch phase to provide two additional electrical pathways to shunt the gate line to VGL 1109. In contrast to the floating ends of gate lines 1001 in FIG. 10, TFTs 1115 electrically connect the end of gate line 1101. In addition to reducing the TFT resistance from the gate line to VGL, providing an electrical connection to the end of the gate line can help to reduce the effective gate line resistance through the length of the gate line. TFTs 1111 and 1115 can similarly be connected to other gate lines in gate line system 1100. The gates of all of the TFTs 1111 and 1115 on one side of the touch screen can be connected to the same synchronization line 1113, so that TFTs 1111 and 1115 can be more easily switched to shunt all of the gate lines to VGL 1109 at the same time. The reduction of the effective resistance of each gate line can help to clamp the gate lines more effectively to the fixed VGL 1109 voltage, which can help to reduce crosstalk due to the error mechanisms described above. While this example embodiment includes three synchronized shunting TFTs per gate line, other embodiments may include any number of one or more TFTs.

Although embodiments of this disclosure have been fully described with reference to the accompanying drawings, it is to be noted that various changes and modifications including, but not limited to, combining features of different embodiments, omitting a feature or features, etc., as will be apparent to those skilled in the art in light of the present description and figures.

For example, one or more of the functions of computing system 200 described above can be performed by firmware stored in memory (e.g. one of the peripherals 204 in FIG. 2) and executed by touch processor 202, or stored in program storage 232 and executed by host processor 228. The firmware can also be stored and/or transported within any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any medium that can contain or store the program for use by or in connection with the instruction execution system, apparatus, or device. The computer readable medium can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, USB memory devices, memory sticks, and the like.

The firmware can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this document, a "transport medium" can be any medium that can communicate, propagate or transport the program for use by or in connection with the instruction execution system, apparatus, or device. The transport readable medium can include, but is not limited to, an electronic, magnetic, optical, electromagnetic or infrared wired or wireless propagation medium.

Example embodiments may be described herein with reference to a Cartesian coordinate system in which the x-direction and the y-direction can be equated to the horizontal direction and the vertical direction, respectively. However, one skilled in the art will understand that reference to a particular coordinate system is simply for the purpose of clarity, and does not limit the direction of the elements to a particular direction or a particular coordinate system. Furthermore, although specific materials and types of materials may be included in the descriptions of example embodiments, one skilled in the art will understand that other materials that achieve the same function can be used. For example, it should be understood that a "metal layer" as described in the examples below can be a layer of any electrically conductive material.

In some embodiments, the drive lines and/or sense lines can be formed of other elements including, for example other elements already existing in typical LCD displays (e.g., other electrodes, conductive and/or semiconductive layers, metal lines that would also function as circuit elements in a typical LCD display, for example, carry signals, store voltages, etc.), other elements formed in an LCD stackup that are not typical LCD stackup elements (e.g., other metal lines, plates, whose function would be substantially for the touch sensing system of the touch screen), and elements formed outside of the LCD stackup (e.g., such as external substantially transparent conductive plates, wires, and other elements). For example, part of the touch sensing system can include elements similar to known touch panel overlays.

In this example embodiment, each sub-pixels can be a red (R), green (G) or blue (B) sub-pixel, with the combination of all three R, G and B sub-pixels forming one color display pixel. Although this example embodiment includes red, green, and blue sub-pixels, a sub-pixel may be based on other colors of light or other wavelengths of electromagnetic radiation (e.g., infrared) or may be based on a monochromatic configuration.

What is claimed is:

1. A method of operating a touch screen having drive regions and sense regions, each drive and sense region having a plurality of pixels with common electrodes connected together along first and second directions, the drive and sense regions arranged for permitting touch sensing by capacitive coupling between the drive and sense regions, the method comprising:

during a touch sensing phase in which a touch is sensed, connecting circuit elements of the pixels in at least the drive regions to a predetermined voltage through at least a first conductive pathway and, at substantially the same time, connecting the same circuit elements of the pixels in at least the drive regions to the same predetermined voltage by a second conductive pathway, the second conductive pathway having at least a portion thereof different from the first conductive pathway;

during a display phase in which an image is displayed on the touch screen, disconnecting the circuit elements from the predetermined voltage; and wherein connecting the circuit elements to the predetermined voltage includes switching a first switching element to connect the circuit elements to the predetermined voltage through the first conductive pathway, and switching a second switching element to connect the circuit elements to the predetermined voltage through the second conductive pathway.

2. The method of claim 1, wherein the first switching element comprises a first transistor and the second switching element comprises a second transistor, and the drive and sense regions are arranged for permitting touch sensing by capacitive coupling between the common electrodes of the drive and sense regions.

3. The method of claim 2, wherein the circuit elements comprise gates of the pixels.

4. The method of claim 3, further comprising:

a first gate line connecting the gates of pixel elements along a first row of the touch screen;

the first transistor has a source or drain connected to the first gate line, the method including controlling display elements of the touch screen along the first row of the touch screen by utilizing the first gate line;

the second transistor has a source or drain connected to the first gate line, the first transistor having a gate input and the second transistor having a gate input; and wherein the method includes connecting the first gate line to the predetermined voltage by turning on the first transistor and the second transistor at substantially the same time utilizing their respective gate inputs.

5. The method of claim 4, further comprising:

during the display phase, connecting the circuit elements to a second predetermined voltage; and during the touch sensing phase connecting the circuit elements of the pixels in the sense regions to the predetermined voltage.

6. The method of claim 5, wherein connecting the first gate line to the predetermined voltage includes switching a third transistor to connect the first gate line to the predetermined voltage through a third conductive pathway, the third conductive pathway having at least portions thereof different from the first and second pathways, the third transistor having a gate input for turning on the third transistor at substantially the same time as turning on the first and second transistors.

7. The method of claim 6, the gate inputs of the second transistor and the third transistor are connected together by a common conductive pathway.

8. The method of claim 6, wherein connecting the first gate line to the predetermined voltage includes switching a fourth transistor to connect the first gate lines to the predetermined voltage through a fourth conductive pathway, the fourth conductive pathway have at least portions thereof different from the first, second and third conductive pathways.

9. The method of claim 1, further comprising:
during the display phase, connecting the circuit elements to a second predetermined voltage; and
during the touch sensing phase connecting the circuit elements of the pixels in the sense regions to the predetermined voltage.

10. The method of claim 1, wherein the circuit elements comprise gates of the pixels.

11. A touch screen having a display phase and a touch phase, the touch screen comprising:
a plurality of drive regions and a plurality of sense regions, each drive and sense region having a plurality of pixels with common electrodes connected together along first and second directions forming rows and columns, the drive and sense regions arranged for permitting touch sensing by capacitive coupling between the common electrodes of the drive and sense regions;
a first transistor with a source or drain connected to a first gate line, the first gate line controlling display elements of the touch screen along a first row of a first drive region of the touch screen, and the first transistor connecting the first gate line to a predetermined voltage during the touch phase;
a second transistor with a source or drain connected to a second gate line, the second gate line controlling display elements of the touch screen along a second row of the first drive region of the touch screen, and the second transistor connecting the second gate line to the predetermined voltage during the touch phase; and
a synchronization line connecting together gates of the first and second transistors during the touch phase such that the first and second transistors shunt the first and second gate lines to the predetermined voltage at the same time.

12. The touch screen of claim 11, further comprising a third transistor connected to the first gate line and a fourth transistor connected to the second gate line, wherein the gates of the third and fourth transistors are disconnected.

13. The touch screen of claim 12 wherein the other of the drain or source of the first and second transistors are connected to the drain or source of the third and fourth transistors respectively.

14. The touch screen of claim 11, wherein the other of the drain or source of the first and second transistors are connected to the predetermined voltage during the touch phase.

15. The touch screen of claim 14, further comprising:
a synchronization system that switches the first and second transistors to connect the first and second gate lines to the predetermined voltage during the touch phase of the touch screen, and that switches the first and second transistors to disconnect the first and second gate lines from the predetermined voltage during a display phase of the touch screen.

16. A touch screen comprising:
a first drive region segment having a plurality of display elements of the touch screen arranged in rows and columns, display elements in the first drive region segment each having a common electrode, and the common electrodes within the first drive region segment connected to one another ;
a second drive region segment having a plurality of display elements of the touch screen arranged in rows and columns, display elements in the second drive region segment each having a common electrode, and the common electrodes within the second drive region segment connected to one another;
a sense region disposed between the first and second drive region segments, the sense region having a plurality of display elements of the touch screen arranged in rows and columns, display elements in the sense region each having a common electrode, and the common electrodes within the sense region connected to one another;
the touch screen operable in a touch phase for sensing touch from capacitive coupling between the common electrodes of the sense region and at least one of the first and second drive region segments when stimulation signals are transmitted through the common electrodes of the display pixels in the first and second drive region segments;
the touch screen operable in a display phase for displaying data using the display elements of the first drive region segment, the second drive region segment and the sense region; the display elements of the first drive region segment, the second drive region segment and the sense region having gate lines controlling switching transistors associated with the display elements within each of the first drive region segment, the second drive region segment and the sense region; and
a clamping circuit for clamping the gate lines of the display elements within the first drive region segment, the second drive region segment and the sense region to a predetermined voltage during the touch phase through at least a first conductive pathway and a second conductive pathway, the second conductive pathway having at least a portion thereof different from the first conductive pathway.

17. The touch screen of claim 16 wherein the clamping circuit comprises:
a first transistor with a source or drain connected to a first gate line, the first transistor coupling the first gate line to the predetermined voltage through the first conductive path during the touch phase;
a second transistor having a source or drain connected to the first gate line, the second transistor coupling the first gate line to the predetermined voltage through the second conductive pathway during the touch phase.

18. The touch screen of claim 17, further comprising:
a first gate driver for driving the first gate line for display of the data during the display phase;
the first gate driver having third transistor having a source or drain connected to the first gate line, the third transistor coupling the first gate line to the predetermined voltage through a third conductive pathway during the touch phase, the third conductive pathway having at least a portion thereof different from the first and second conductive pathways.

19. The touch screen of claim 18, further comprising a fourth transistor having a source or drain connected to the first gate line, the fourth transistor coupling the first gate line to the predetermined voltage through a fourth conductive pathway during the touch phase. the fourth conductive pathway having at least a portion thereof different from the first, second and third conductive pathways.

20. The touch screen of claim 19 wherein the first and second transistors have gate inputs connected to at least one synchronization line for turn on the first and second transistors during the touch phase.

21. The touch screen of claim 16, further comprising at least one tunnel line connecting the common electrodes of the first drive region segment to the common electrodes of the second drive region segment; and
wherein the fourth transistor has a gate input connected to the one or more synchoronizaton lines.

22. A touch screen comprising:
a plurality of drive regions and a plurality of sense regions, each drive and sense region having a plurality of pixels with common electrodes connected together along first and second directions forming rows and columns, the drive and sense regions arranged for permitting touch sensing by capacitive coupling between the drive and sense regions;
a first circuit for connecting circuit elements of at least the drive regions of the touch screen to a predetermined voltage through at least a first and second conductive pathway during a touch sensing phase in which a touch is sensed, the second conductive pathway having at least a portion thereof different from the first conductive pathway, the first and second conductive pathways connecting the circuit elements of at least the drive region to the predetermined voltage at substantially the same time;
a second circuit for disconnecting the circuit elements from the predetermined voltage during a display phase in which an image is displayed on the touch screen; and
wherein the first circuit includes a first switching element o connect the circuit elements to the predetermined voltage through the first conductive pathway. and a second switching element to connect the circuit element to the predetermined voltage through the second conductive pathway.

23. The touch screen of claim 22, wherein the first switching element comprises a first transistor and the second switching element comprises a second transistor.

24. The touch screen of claim 22 wherein the circuit elements comprise gates of the pixels in at least the drive regions of the touch screen.

25. The touch screen of claim 24, wherein:
wherein the first circuit includes a first transistor to connect the circuit elements to the predetermined voltage through the first conductive pathway, and a second transistor to connect the circuit element to the predetermined voltage through the second conductive pathway;
the first transistor has a source or drain connected to a first gate line, the first gate line controlling display elements of the touch screen along a first row of the touch screen; and
the second transistor has a source or drain connected to the first gate line;
the first transistor having a gate input and the second transistor having a gate input; and
wherein the gate inputs of the first transistor and the second transistor turn on the first and second transistors at the same time to connect the first gate line to the predetermined voltage.

26. The touch screen of claim 25, wherein a third transistor is switched to connect the first gate line to the predetermined voltage through a third conductive pathway, the third conductive pathway having at least portions thereof different from the first and second pathways, the third transistor having a gate input for turning on the third transistor.

27. The touch screen of claim 26, wherein the gate inputs of the second transistor and the third transistor are connected together by a common conductive pathway.

28. The touch screen of claim 27, wherein a fourth transistor is switched to connect the circuit elements to the predetermined voltage through a fourth conductive pathway, the fourth conductive pathway have at least portions thereof different from the first, second and third conductive pathways.

* * * * *